US008029921B2

(12) United States Patent
Harris et al.

(10) Patent No.: US 8,029,921 B2
(45) Date of Patent: Oct. 4, 2011

(54) GROWTH OF HIGH QUALITY LOW-LOSS FERRITE MATERIALS ON WIDE BANDGAP SEMICONDUCTOR SUBSTRATES

(75) Inventors: Vincent G Harris, Sharon, MA (US); Zhaohui Chen, Medford, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 923 days.

(21) Appl. No.: 11/538,452

(22) Filed: Oct. 4, 2006

(65) Prior Publication Data
US 2007/0103250 A1  May 10, 2007

Related U.S. Application Data

(60) Provisional application No. 60/723,454, filed on Oct. 5, 2005.

(51) Int. Cl.
*B32B 15/04* (2006.01)
(52) U.S. Cl. .................................................. 428/693.1
(58) Field of Classification Search .............. 428/692.1, 428/693.1; 333/1.1, 24.2
See application file for complete search history.

(56) References Cited

U.S. PATENT DOCUMENTS

| | | | | |
|---|---|---|---|---|
| 5,567,523 | A * | 10/1996 | Rosenblum et al. | 428/408 |
| 6,110,557 | A * | 8/2000 | Weir et al. | 428/830 |
| 2004/0165428 | A1 * | 8/2004 | Odagawa et al. | 365/171 |

OTHER PUBLICATIONS

Chen et al. "Growth of Ba-hexaferrite films on single crystal 6-H SiC." Journal of Magnetism and Magnetic Materials 301(2005): 166-170.*
Oliver et al. "Growth and characterization of thick oriented barium hexaferrite films on MgO (111) substrates." Applied Physics Letters 76(2000): 3612-3614.*
Wang et al. "Microwave and magnetic properties of double-side hexaferrite films on (111) magnesium oxide substrates." Journal of Applied Physics 92(2002): 6728-6732.*
Liu et al. "Barium ferrite (BaFe12O19) thin film prepared by pulsed laser deposition on MgO buffered Si substrates." Applied Physics A: Materials Science & Processing 80(2003): 611-614.*

* cited by examiner

*Primary Examiner* — Holly Rickman
*Assistant Examiner* — Lisa Chau
(74) *Attorney, Agent, or Firm* — Amy Ressing; Joslyn Barritt

(57) ABSTRACT

A semiconductor device including a ferrite layer, a wideband-gap semiconductor material layer, and a buffer layer. The buffer layer comprises an interweaving of MgO and BaM. In addition the buffer layer allows a gradual reduction of the interfacial stress, and mediates the strain between a silicon substrate and a ferrite layer of the device. In addition, the buffer layer allows for high crystal alignment resulting in high crystal quality and thereby producing a low microwave loss semiconductor device. The buffer layer also minimizes chemical interdiffusion of atoms between the substrate and the ferrite layer.

12 Claims, 5 Drawing Sheets

GROWTH OF HIGH QUALITY LOW-LOSS FERRITE MATERIALS ON WIDE BANDGAP SEMICONDUCTOR SUBSTRATES

CROSS REFERENCE TO RELATED APPLICATION

The present application claims benefit under 35 U.S.C. §119 (e) of a provisional application filed Oct. 5, 2005, entitled "GROWTH OF HIGH QUALITY LOW-LOSS FERRITE MATERIALS ON SiC SUBSTRATES FOR MICROWAVE AND MM APPLICATIONS", Application No. 60/723,454.

BACKGROUND OF THE INVENTION

1. Field of the Invention

The present invention relates generally to semiconductor materials. More specifically, the present invention relates to growth of ferrite materials on a semiconductor substrate.

2. Description of the Related Art

The next generation of radar electronics employs simultaneous transmit and receive (STAR) technology incorporating magnetic ceramics in multiport devices allowing simultaneous transmission of electromagnetic signals. The applications of this technology are within radar systems that enable continuous tracking of multiple targets. This technology is also applicable in the wireless communications market as well, cellular, and satellite communications.

An important component to radar electronics is the circulator. The operation of a circulator is based on the manipulation of electromagnetic (EM) signals in a multiport nonreciprocal device. For example, the signal entering into the first port is wholly coupled to an adjacent port while the EM signal is isolated from the other port(s). Circulators with three or more ports have nonreciprocal properties that are highly valued in many microwave systems. Magnetic ceramics, such as ferrites, that are biased in a DC magnetic field exhibit anisotropic wave propagation characteristics. These characteristics of the EM waves gives rise to a non-reciprocal rotation of the plane of polarization of the EM wave, a non-reciprocal phase shift and a non-reciprocal displacement of the microwave field pattern. Ferrites (e.g., magnetic oxides that have both desirable dielectric and magnetic properties and, most importantly, are insulators) have been an integral part of nearly all circulator device designs that operate at μ- and mm-wave frequencies.

Although spinel ferrites and garnets have been used in many applications from 1-10 GHz, the hexaferrites with appropriate cation substitutions have proven to be versatile for applications from 1-100 GHz. Ba-hexaferrite (BaM) is the prototypical material that is considered to be an enabling material for such applications. Accordingly, it would be desirable to employ hexaferrites in circulators, isolators, filters, and phase shifter applications.

In addition, one long standing problem facing the ferrite materials and device communities is the need for integration of these ferrite devices with semiconductor platforms (i.e. CMOS systems). In order to make this a reality one needs to process ferrites on semiconductor substrates. High crystal quality, low microwave loss, ferrites are processed at elevated temperatures typically approximately 900° C.; temperatures at which traditional semiconductor materials degrade. This has been the limiting factor.

The deposition of ferrites onto a semiconductor substrate is currently not possible due to the mismatch in lattice parameters between BaM and SiC, for example. In other words, the atoms within the ferrite (BaM) layer and the semiconductor (SiC) layer are unable to properly align causing strains and poor crystal alignment. In microwave applications, for example, this mismatch leads to unacceptable losses.

In recent years new wide bandgap semiconductor materials (i.e., SiC and GaN) have been developed that are stable to very high temperatures. With a high saturated drift velocity ($\sim 2.7 \ast 10^7$ cm/s), wide bandgap (3.03 eV), and high breakdown electric field strength ($2.4 \times 10^6$ V/cm), SiC holds unique potential as a substrate for the next generation of high-temperature, high-frequency, high-power electronics. In contrast to other substrates being used in ICs and MMICs (monolithic microwave integrated circuits), the strong covalent Si—C bond provides this material with high thermal stability and chemical inertness. Furthermore, the atomic lattice mismatch between SiC and BaM is less than 5% allowing for their possible integration.

SUMMARY OF THE INVENTION

One aspect of the present invention is to gradually reduce the interfacial stress and mediate the strain between the plurality of layers in an embodiment of the present invention.

An additional aspect of the present invention is to allow for proper crystal alignment resulting in high crystal quality and thereby producing low microwave losses in an embodiment of the present invention.

A still further aspect of the present invention is to employ a buffer layer within a semiconductor device including layers of BaM and MgO, and use this device in microwave applications. Additionally, these layers of BaM and MgO can be interwoven together to form the buffer layer.

Yet another aspect of the present invention employs having the MgO layer decrease in thickness as it is deposited distal from the SiC layer, whereas the BaM layer maintains a constant thickness moving from the SiC layer.

A still further aspect of the present invention employs the buffer layer operable to minimize chemical interdiffusion between the ferrite layer and the wideband gap semiconductor material layer.

The above described disadvantages are overcome and advantages realized by the present invention including a device comprising a ferrite layer, a wideband gap semiconductor material layer, a buffering layer disposed between the ferrite layer and the wideband gap semiconductor material layer, wherein the buffering layer reduces strain at an interface between the ferrite layer and the wideband gap semiconductor material layer, and wherein the buffering layer produces a crystalline quality device for use in microwave frequency applications resulting in acceptably low microwave losses.

BRIEF DESCRIPTION OF THE DRAWINGS

A more complete appreciation of the invention will be readily obtained by reference to the following description of the example embodiments and the accompanying drawings.

DETAILED DESCRIPTION OF PREFERRED EMBODIMENTS

Figure 1:
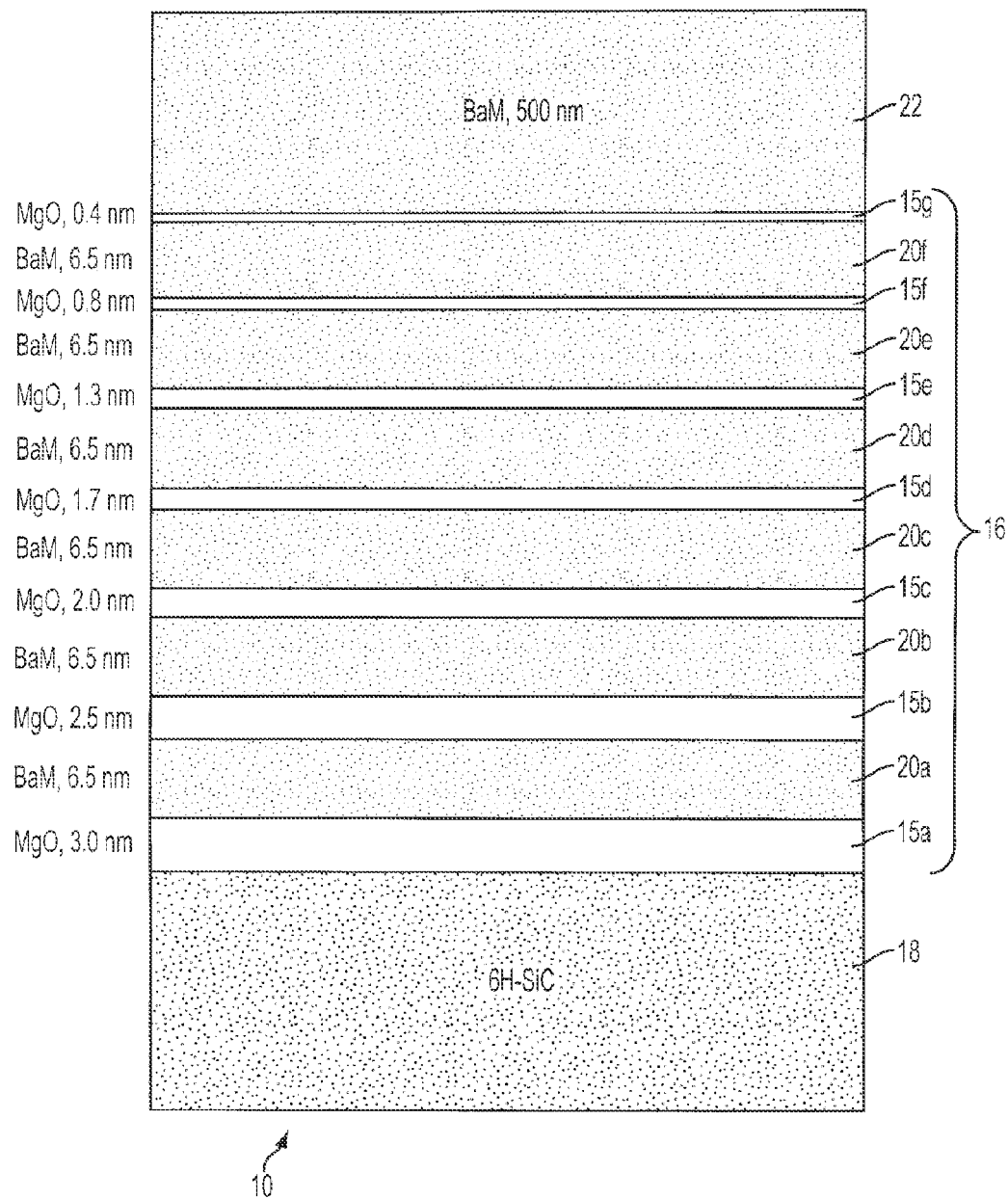
FIG. 1 illustrates the device employing hexaferrite layers and a wide bandgap semiconductive material layer constructed in accordance with an embodiment of the present invention.

The present invention comprises a plurality of layers 10 including a hexaferrite layers 20a-f, a buffer layer 16 and a silicon carbide layer 18. The buffer layer 16 comprises a plurality of magnesium oxide (MgO) layers 15a-g and barium hexaferrite (BaM) layers 20a-f. The layers 15 a-g and layers 20 a-f can be interwoven to produce buffer layer 16, in an additional embodiment of the present invention. These layers act to gradually reduce the interfacial stress, mediate the strain and allow for proper crystal alignment resulting in high crystal quality and thereby producing low microwave losses in the applications in which the plurality of layers 10 are employed. High crystal quality results in low microwave losses as determined by low ferromagnetic resonance (FMR) linewidths. Moreover, the high crystal alignment needed in the microwave applications mentioned above, are achieved by an embodiment of the present invention and demonstrated by X-ray diffraction data as discussed in detail below.

The present invention allows for reduction in interfacial stress and strain, as well as high crystal alignment through the use of buffer layer 16. The buffer layer 16 comprises each of the MgO layers 15a-f, which gradually decreases in thickness as the layers proceed upward toward the upper hexaferrite layer 22. The intervening hexaferrite layers, 20a-g, maintain a constant thickness as they alternate with the MgO layers 15a-f.

The magnesium oxide is chosen as an element of the buffer layer 16 for two reasons. First, BaM of high crystal quality and proper crystal alignment can be grown routinely on MgO substrates. Second, the atomic spacing of magnesium oxide is between that of silicon carbide and barium hexaferrite and therefore serves as an effective means to mediate interfacial strain. By introducing magnesium oxide on the surface of the SiC, the MgO lattice is strained to nearly match the atomic spacing of the SiC. As the MgO layer thickness is increased the MgO lattice, strained by the SiC, gradually relaxes to that of MgO. By growing a thin layer of BaM on the MgO the atomic spacing of the MgO is strained to match that of the BaM. The initial MgO layer is the thickest, therefore the most relaxation is desired in this region. Subsequent bilayers (MgO/BaM) are added in which the MgO layer thickness is reduced.

The magnesium oxide layer 15a has a thickness of at least 7 magnesium oxide unit cells, this results in a thickness of 3 nm. The subsequent layers of the magnesium oxide 15b-g having thicknesses of 2.5, 2, 1.7, 1.3, 0.8, and 0.4 nm., respectively, corresponding to unit cell repeats of approximately 7, 6, 5, 4, 3, 2, and 1. The thickness of the barium hexaferrite layer within the buffer layers 20a-f remain fixed at 6 nm or 2.5 unit cells or 20 oxygen layers.

The SiC substrates employed in an embodiment of the present invention are acquired from Cree Inc. and are commercial n-type 6H—SiC with the resistivity of .about.0.02 Ω-cm, with lattice parameters of a=3.08 Å and c=15.11 Å. However, it should be understood that similar SiC substrates can be employed in the present invention from other sources having similar parameters. The lattice parameter of Ba(M-type) hexaferrite is a=5.89 Å and c=23.1 Å allowing for a 2×1 lattice match of the basal plane to SiC with a lattice mismatch of 4.38%. Different surface preparation techniques can be used, including both wet chemical and dry etch procedures. In the wet chemical etch preparation, standard semiconductor cleaning processes can be employed that include exposure to boiling $H_2SO_4+H_2O_2$ acid, $NH_3OH+H_2O_2$, $HNO_3+HF$, and a final rinsing with deionized water. The dry etch process includes ion beam bombardment with Ar gas in a Kaufman-type ion source operating between 500-1000 eV. This process removes several atomic layers of the substrate by sputtering and is then followed by a hydrogen gas purge to hydrogen terminate the surface.

Pulsed laser deposition (PLD) is used to grow Ba-hexaferrite films on the SiC substrates. The excimer laser used in PLD operates at approximately 248 nm wavelength with energy of approximately 350 mJ per shot. The substrates are held at approximately 925° C. during deposition. This temperature grows the best Ba-hexaferrite films (on MgO substrates). Each growth cycle is started at a slow pulse rate of 1 Hz leading to a low deposition rate, and is then increased to 5 Hz. A series of films are processed at oxygen pressures ranging from 1 to 400 mTorr under the same temperature and laser processing conditions. After film deposition, each sample is cooled to room temperature at a negative ramp of 6° C. per minute. A post-deposition thermal treatment is implemented by annealing the substrate at temperatures ranging from 750° to 1100° C. in air. The resulting films are characterized for structure and morphology by x-ray diffraction and atomic force microscopy, respectively, and for magnetic properties using vibrating sample magnetometry.

The substrate temperature is well known to be a factor in crystal growth. At low substrate temperatures the atoms experience reduced mobility and result in a small-grained microstructure which is lossy at microwave frequencies. However, higher substrate temperatures often induce diffusion between the film and substrate and are often incompatible with device fabrication. Previous research of $BaFe_{12}O_{19}$ grown on MgO and sapphire indicate that temperatures in the range of 925° C. produce the best quality films as judged by their magnetic and structural properties.

A subset of samples can be processed using an embodiment of the present invention, as described above, wherein thin layers of MgO are introduced in the early stages of film growth (first 50 nm). This is done to reduce the interfacial strain between the BaM and the SiC. Specifically, the film growth procedure begins with a sequence of laser shots on MgO and BaM targets alternately. The laser repetition frequency is 5 Hz. This process thereby forms the buffer layer 16 allowing for minimal diffusion into the silicon carbide layer 18 through to the barium hexaferrite layer 22. Accordingly, the buffer layer 16 absorbs the plurality of atoms and inter-diffuses those atoms within buffer layer 16, as discussed below in FIGS. 5(a) and 5(b). Accordingly, an embodiment of the present invention allows for mediation of resulting stress and strain between barium hexaferrite layer 22 and silicon carbide layer 18, in addition the buffer layer reduces crystalline defects resulting from the strain and furthermore, allows for minimal diffusion between layers 18 and 22.

Figure 4:
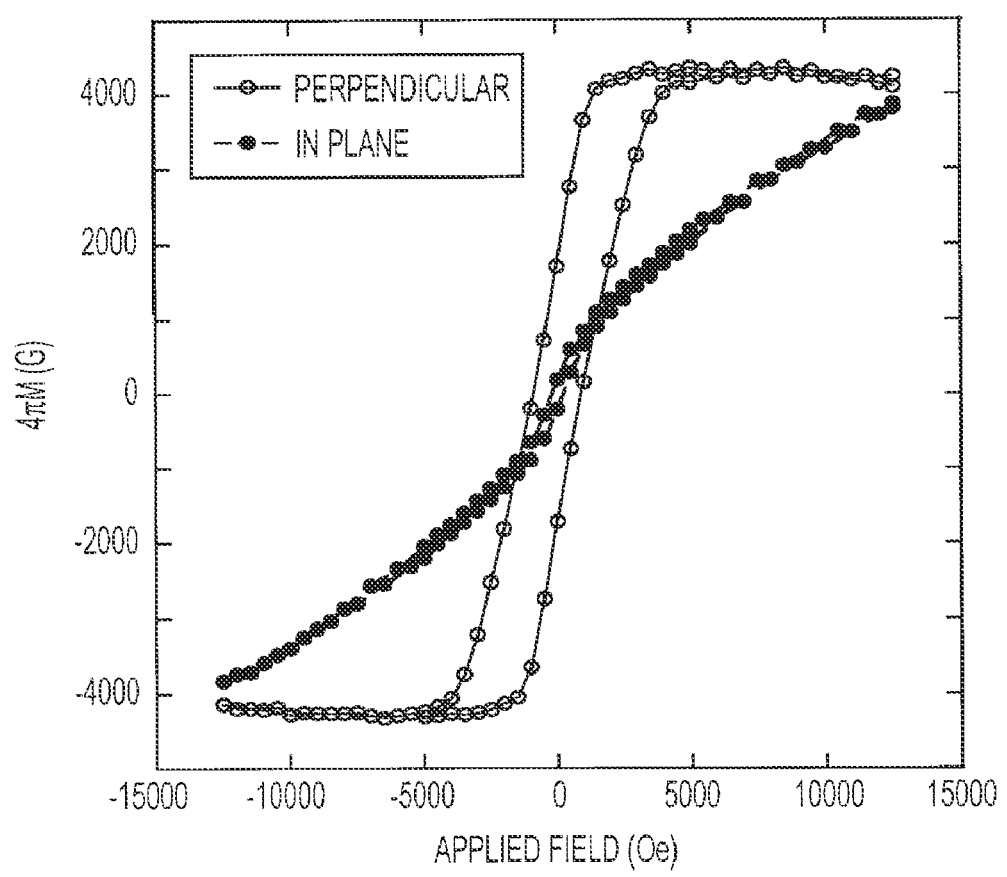
FIG. 4 is graph illustrative of a hysteresis loop of film samples in which MgO are introduced in the early stages of film growth of the device constructed in accordance with an embodiment of the present invention.
Figure 6:
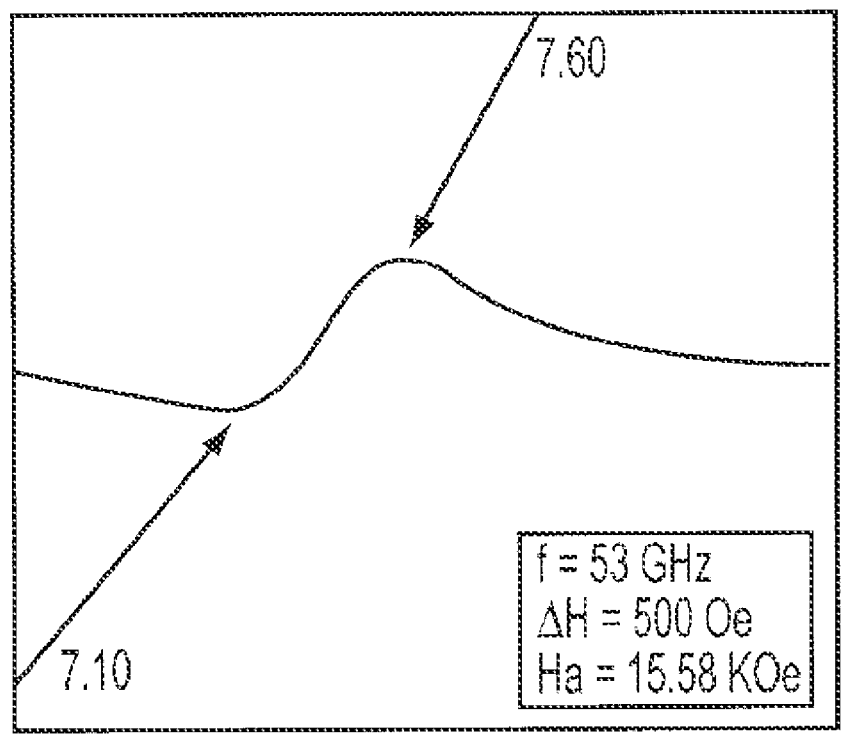
FIG. 6 is a graph illustrative of a ferromagnetic resonance signal having a linewidth at 53 GHz. Of 500 Oe of the device constructed in accordance with an embodiment of the present invention.

These benefits resulting from an embodiment of the present invention 10 are demonstrated by three results, X-Ray diffraction demonstrates appropriate crystal orientation, VSM hysteresis loops demonstrate the appropriate magnetic orientation as depicted by FIG. 4 and the FMR demonstrates the acceptably low microwave losses, as exhibited by the devices of the present invention in FIG. 6.

Figure 2:
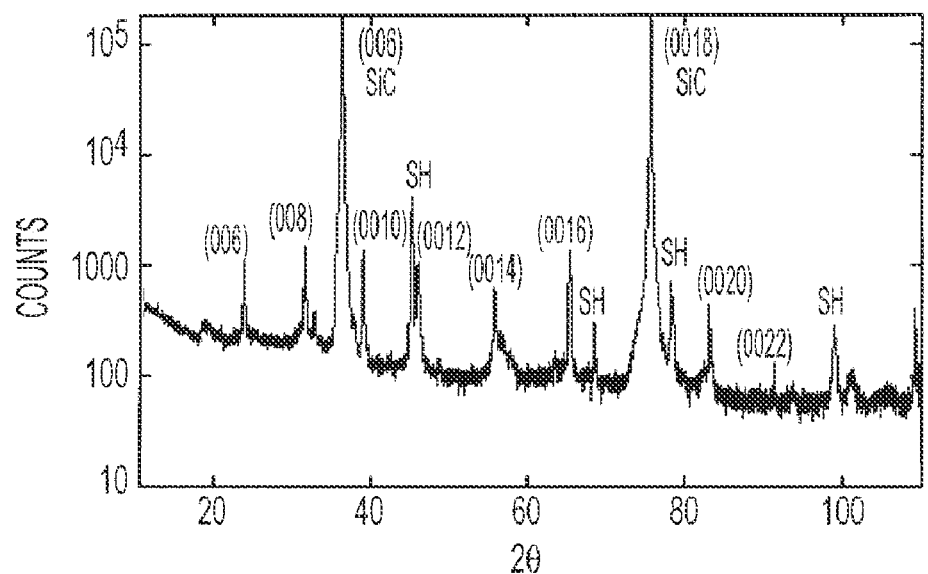
FIG. 2 is a graph illustrative of a clear hexagonal crystal x-ray diffraction pattern of the device constructed in accordance with an embodiment of the present invention.

A clear hexagonal crystal structure is evident in the X-ray diffraction pattern of all the PLD films produced. A representative X-ray diffraction θ-2θ pattern is plotted in FIG. 2. In all samples the diffraction features are indexed to the hexagonal indices (0,0,2n) having space group P6/mmc indicating the growth of c-axes perpendicular to the film plane.

Figure 3:
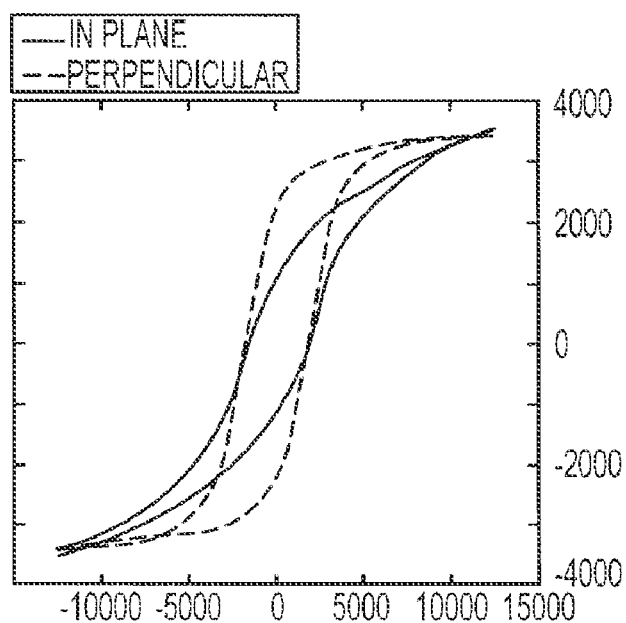
FIG. 3 is a graph illustrative of the magnetic hysteresis loops for films deposited on the device constructed in accordance with an embodiment of the present invention at 200 mtorr of oxygen pressure.

Magnetic hysteresis loops (4 □Ms (G) vs Happ (Oe)) for films deposited at 200 mtorr oxygen pressure is presented in FIG. 3. In these data one observes that the easy, or preferred direction of magnetization, magnetic axis is aligned perpendicular to the film plane, and the hard, or least favorable direction of magnetization, axis in the film plane. The hard direction requires the most energy to align the magnetization along this direction. The development of the magnetic easy axis perpendicular to the film plane is a required property for circulator device applications. In FIG. 3, the easy loop is sheared from the effects of the demagnetizing energy. The DC magnetic properties of particular importance are the coercivity ($H_c$), anisotropy field ($H_a$), squareness ($M_r/M_s$), and saturation magnetization ($4\pi M_s$). The anisotropy field is estimated as the linear extrapolation of the hard loop to the saturation region of the easy loop and is approximated to be 16+/−1 kOe in reasonable agreement with the bulk $BaFe_{12}O_{19}$ value of 17 kOe. Accordingly, the fact that we measure a magnetic anisotropy field exhibiting these values, is further evidence that the device 10 is of high quality with perpendicular crystal orientation.

An additional factor in demonstrating the effectiveness of device 10, as mentioned above, is VSM. Accordingly, for microwave applications, the loss is often proportional to $H_c$, whereas the magnetization and $H_a$ determine the operational frequency and bandwidth, and the loop squareness indicates the degree that the material is self-biased. The ability to process $BaFe_{12}O_{19}$ as self biased films (i.e. high squareness with low coercivity) may allow for the elimination of the biasing magnets presently required in the design of microwave circulators.

Hysteresis loops of film samples in which MgO was introduced in the early stages of film growth are shown in FIG. 4. In contrast to FIG. 3 the in-plane coercivity is small and the anisotropy field is large. This is a desirable property that usually translates to narrow FMR linewidths and is evidence that the introduction of MgO in the early stage of film growth enhances the magnetic properties presumably due to the reduction of interfacial strain and related defects.

Figure 5A:
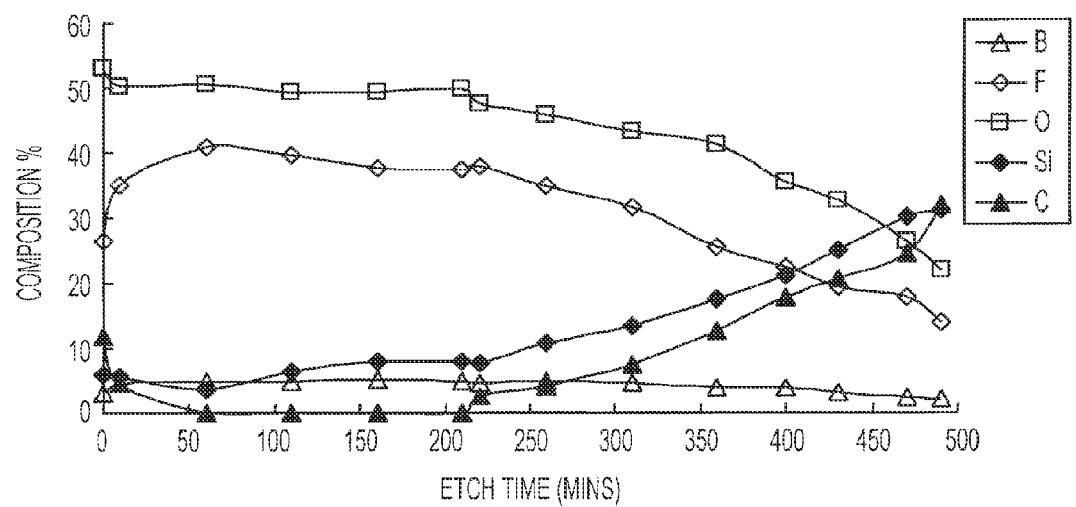
FIGS. 5(a) and (b) are graphs illustrative of compositional depth profile to facilitate observing diffusion across the film substrate material interface of the device constructed in accordance with an embodiment of the present invention.
Figure 5B:
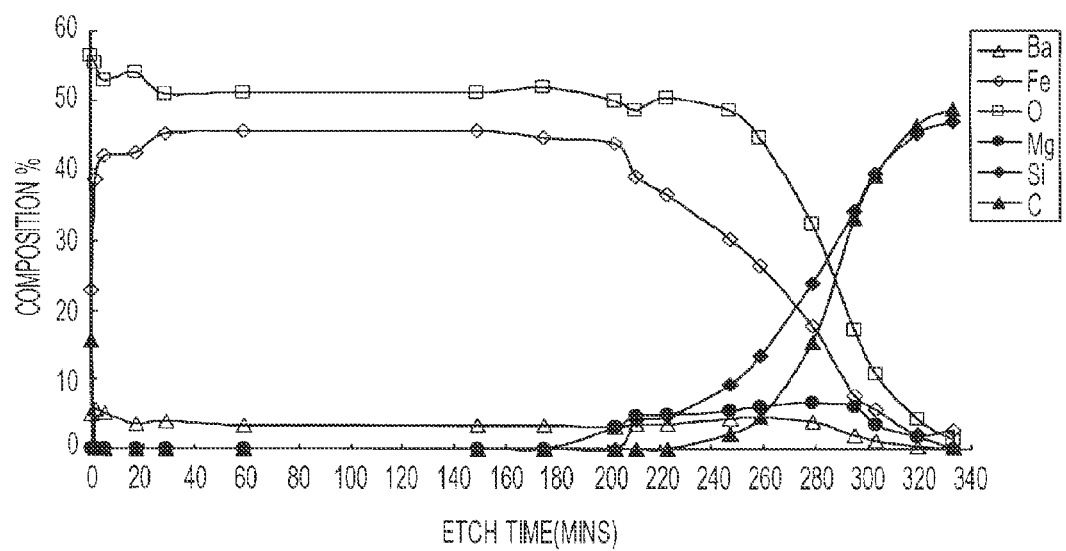

In FIG. 5, we provide a compositional depth profile. In this FIG. 5(a) we observe significant chemical interdiffusion across the film substrate interface. However, in samples made with the woven MgO layer as seen in FIG. 5(b) there is a clear reduction in the chemical interdiffusion. This lack of chemical interdiffusion results in improved films as judged by the reduced FMR linewidth. The chemical interdiffusion of silicon and carbon into barium hexaferrite leads to non-uniformities in the magnetic anisotropy fields that increase the microwave loss making the films unacceptable for microwave device considerations. The deposition of the buffer layer, or woven layer of MgO/BaM proved to be superior to MgO alone since the buffer layer dramatically reduced the diffusion across the BaM-SiC interface.

Ferromagnetic resonance (FMR) measurements provide a FMR linewidth (dH) that is universally accepted as the microwave loss figure of merit. Values less than 500 Oe are considered acceptable for many MMIC applications. FMR measurements performed on BaM(MgO)/SiC revealed linewidths of less than 500 Oe. The improved performance of these films grown using the woven MgO buffer are attributed to the this buffer that acts as a diffusion barrier as well as strain and defect remediation. FMR linewidths for samples grown without the BaM(MgO) buffer layer had values greater than 2000 Oe. As shown in FIG. 6, a Ferromagnetic resonance signal through an embodiment of the present invention having a linewidth at 53 GHz of 500 Oe. is depicted.

An embodiment of the present invention allows for the growth of low loss ferrites on a wide bandgap semiconductor substrate that is anticipated for use in high frequency-high power microwave and mi-wave applications. Ferrites include the following classes of magnetic oxides: garnets, spinel ferrites, hexaferrites. Wide bandgap materials include SiC, GaN, AlN, BN, ZnO, diamond, and GaAs. The oxide buffering layer, MgO, can be replaced by aluminum oxide, sapphire, strontium titanium oxide, barium titanium oxide, or any oxide material that has a lattice mismatch to the ferrite material of less than 5%. This lattice mismatch can be defined as a 1×1 unit cell match or any integer number unit cell match (for example 2 to 1). The interwoven layering scheme presented as an embodiment of the present invention may include the variation of the oxide buffering compound from 20 unit cells to 1 unit cell with the ferrite material thickness fixed at 1-20 unit cells or varied from 1-20 unit cells.

The hexaferrite grown on SiC have desirable properties. These properties include, but are not limited to the following: Deposition of ferrite materials on SiC without the degradation of the substrate material, magnetic anisotropy (that is, the direction of preferred magnetization is perpendicular to the film plane.) This is a highly desirable property of materials intended for many microwave and mm-wave applications. Magnetic anisotropy fields of 16+/−1 kOe (very near bulk single crystal values). High crystal texturing with the c-axis of the grains aligned perpendicular to the film plane. Under some processing conditions, high hysteresis loop squareness suggests the possible use of these materials as self biased media, that is, the required biasing magnets can be omitted allowing for much smaller devices.

The employment of a interwoven MgO/BaM interface buffer layer. as constructed according to an aspect of the present invention, has proven useful in reducing interface diffusion and ultimately providing improved microwave loss performance. Films grown with this buffer layer have the following properties, but are not limited to these properties alone. These properties include strong uniaxial magnetic anisotropy with the easy magnetic axis out of the film plane, high magnetic anisotropy fields with corresponding low coercivities, FMR linewidths of <500 Oe, ferromagnetic resonance (FMR) measurements provide a FMR linewidth (dH) that is universally accepted as the microwave loss figure of merit. Values less than 500 Oe are considered acceptable for MMIC applications. FMR measurements performed on BaM (MgO)/SiC revealed linewidths of less than 500 Oe. Applications of an embodiment of the present invention include, but are not limited to, for examples circulator applications (1-100 GHz), isolators, filters, and phase shifters.

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

What is claimed is:

1. A semiconductor device comprising:
    a ferrite layer;
    a wide bandgap semiconductor material layer, the wide bandgap semiconductor material comprising one of SiC, GaN, AlN, BN, ZnO, and diamond; and
    a buffer layer comprising a plurality of interwoven oxide and hexaferrite layers disposed between said ferrite layer and said wide bandgap semiconductor material layer, the oxide layer comprising one of magnesium oxide, aluminum oxide, sapphire, strontium titanium oxide, barium titanium oxide, a first surface of the buffer layer being in direct contact with said ferrite layer and a second surface of the buffer layer opposite the first surface being in direct contact with said wide bandgap semiconductor material layer;
    wherein said buffer layer reduces strain at an interface between said ferrite layer and said wide bandgap semiconductor material layer; and
    wherein a configuration of said buffer layer between said ferrite layer and said wide bandgap semiconductor material layer produces a crystalline quality device suitable for use in at least one of a microwave and a millimeter-wave application.

2. The device of claim 1, wherein said ferrite layer comprises a barium M-type (BaM) hexaferrite layer.

3. The device of claim 1, wherein said buffer layer enables said ferrite layer to include at least one magnetic anisotropy field corresponding to 85% or greater of a single crystal value of said ferrite layer.

4. The device of claim 1, wherein said device exhibits FMR linewidths less than 500 Oe.

5. The device of claim 1, wherein said metal oxide layers progressively decrease in thickness with respect to said hexaferrite layers from one end to the other end within said buffer layer and said hexaferrite layers maintain a uniform thickness within said buffer layer.

6. The device of claim 5, wherein said oxide layers comprise seven successive layers having a thickness of 3 nm, 2.5 nm, 2 nm, 1.7 nm, 1.3 nm, 0.8 nm, and 0.4 nm, respectively, and each of said ferrite layers has a fixed thickness of 6 nm within said buffer layer.

7. The device of claim 1, wherein said buffer layer minimizes chemical interdiffusion between said ferrite layer and said wide bandgap material layer.

8. The device of claim 1, wherein said device is operable within a circulator.

9. The device of claim 1, wherein said device is operable within an isolator.

10. The device of claim 1, wherein said ferrite layer comprises one of a garnet, a spinel ferrite, and a hexaferrite.

11. A semiconductor device comprising:
    a ferrite layer;
    a wide bandgap semiconductor material layer comprising one of SiC and GaN; and
    a buffer layer comprising a plurality of interwoven oxide and hexaferrite layers disposed between said ferrite layer and said wide bandgap semiconductor material layer, a first surface of the buffer layer being in direct contact with said ferrite layer and a second surface of the buffer layer opposite the first surface being in direct contact with said wide bandgap semiconductor material layer;
    wherein said buffer layer reduces strain at an interface between said ferrite layer and said wide bandgap semiconductor material layer; and
    wherein a configuration of said buffer layer between said ferrite layer and said wide bandgap semiconductor material layer produces a crystalline quality device suitable for use in at least one of a microwave and a millimeter-wave application.

12. The device of claim 11, wherein said ferrite layer comprises a barium M-type (BaM) hexaferrite layer.

* * * * *